United States Patent
Yoshino et al.

(10) Patent No.: US 10,249,494 B2
(45) Date of Patent: Apr. 2, 2019

(54) FREE-STANDING SUBSTRATE, FUNCTION ELEMENT AND METHOD FOR PRODUCING SAME

(71) Applicant: NGK INSULATORS, LTD., Nagoya, Aichi (JP)

(72) Inventors: Takashi Yoshino, Ama (JP); Katsuhiro Imai, Nagoya (JP); Masahiro Sakai, Nagoya (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 15/661,822

(22) Filed: Jul. 27, 2017

(65) Prior Publication Data
US 2017/0330749 A1    Nov. 16, 2017

Related U.S. Application Data (63) Continuation of application No. PCT/JP2016/052435, filed on Jan. 28, 2016.
(Continued)

(51) Int. Cl.
*H01L 21/00* (2006.01)
*H01L 21/02* (2006.01)
(Continued)

(52) U.S. Cl.
CPC ........ *H01L 21/02639* (2013.01); *C30B 7/105* (2013.01); *C30B 9/10* (2013.01);
(Continued)

(58) Field of Classification Search
CPC ........... H01L 21/0242; H01L 21/02639; H01L 21/02433; H01L 21/0254; H01L 21/02389;
(Continued)

(56) References Cited

U.S. PATENT DOCUMENTS 9,090,988 B2   7/2015   Sakai et al.
9,640,720 B2   5/2017   Watanabe et al.
(Continued)

FOREIGN PATENT DOCUMENTS

JP   09-027636 A   1/1997
JP   2006-066496 A   3/2006
(Continued)

OTHER PUBLICATIONS

International Search Report for PCT/JP2016/052435 (1 page).
(Continued)

*Primary Examiner* — Hsien Ming Lee
(74) *Attorney, Agent, or Firm* — Flynn Thiel, P.C.

(57) ABSTRACT

A self-supporting substrate includes a first nitride layer grown by a hydride vapor deposition method or ammonothermal method and comprising a nitride of one or more elements selected from the group consisting of gallium, aluminum and indium; and a second nitride layer grown by a sodium flux method on the first nitride layer and comprising a nitride of one or more elements selected from the group consisting of gallium, aluminum and indium. The first nitride layer includes a plurality of single crystal grains arranged therein and extending between a pair of main faces of the first nitride layer. The second nitride layer includes a plurality of single crystal grains arranged therein and extending between a pair of main faces of the second nitride layer. The first nitride layer has a thickness larger than a thickness of the second nitride layer.

37 Claims, 4 Drawing Sheets

Related U.S. Application Data (60) Provisional application No. 62/109,179, filed on Jan. 29, 2015.

(51) Int. Cl.

| | | |
|---|---|---|
| *C30B 7/10* | (2006.01) | |
| *C30B 9/12* | (2006.01) | |
| *C30B 25/04* | (2006.01) | |
| *C30B 25/18* | (2006.01) | |
| *C30B 29/20* | (2006.01) | |
| *C30B 29/40* | (2006.01) | |
| *C30B 29/68* | (2006.01) | |
| *H01L 21/78* | (2006.01) | |
| *H01L 29/34* | (2006.01) | |
| *H01L 33/00* | (2010.01) | |
| *H01L 33/02* | (2010.01) | |
| *H01L 33/32* | (2010.01) | |
| *C30B 9/10* | (2006.01) | |
| *C30B 19/02* | (2006.01) | |
| *C30B 19/12* | (2006.01) | |
| *C30B 28/04* | (2006.01) | |
| *C30B 28/14* | (2006.01) | |
| *H01L 29/20* | (2006.01) | |
| *H01L 29/872* | (2006.01) | |
| *H01L 29/45* | (2006.01) | |
| *H01L 29/66* | (2006.01) | |
| *H01L 29/778* | (2006.01) | |

(52) U.S. Cl.
CPC ............... *C30B 9/12* (2013.01); *C30B 19/02* (2013.01); *C30B 19/12* (2013.01); *C30B 25/04* (2013.01); *C30B 25/18* (2013.01); *C30B 28/04* (2013.01); *C30B 28/14* (2013.01); *C30B 29/20* (2013.01); *C30B 29/406* (2013.01); *C30B 29/68* (2013.01); *H01L 21/02002* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 21/02513* (2013.01); *H01L 21/02579* (2013.01); *H01L 21/02595* (2013.01); *H01L 21/02609* (2013.01); *H01L 21/7806* (2013.01); *H01L 29/34* (2013.01); *H01L 33/007* (2013.01); *H01L 33/0079* (2013.01); *H01L 33/025* (2013.01); *H01L 33/32* (2013.01); *H01L 29/2003* (2013.01); *H01L 29/452* (2013.01); *H01L 29/66212* (2013.01); *H01L 29/7786* (2013.01); *H01L 29/872* (2013.01)

(58) Field of Classification Search
CPC ............. H01L 21/02458; H01L 21/246; H01L 21/28675; H01L 29/2003; H01L 29/452; H01L 29/454; H01L 29/475; H01L 33/0062; H01L 33/07; H01L 33/007; H01L 33/0075; H01L 33/16
USPC ............................................ 438/46, 77, 604
See application file for complete search history.

(56) References Cited

U.S. PATENT DOCUMENTS

| | | |
|---|---|---|
| 2007/0215901 A1 | 9/2007 | Shibata |
| 2015/0144956 A1 | 5/2015 | Watanabe et al. |
| 2015/0187926 A1* | 7/2015 | Kuraoka ............. H01L 29/1033 257/76 |
| 2015/0372191 A1 | 12/2015 | Watanabe et al. |

FOREIGN PATENT DOCUMENTS

| | | |
|---|---|---|
| JP | 2007-246331 A | 9/2007 |
| JP | 5396569 B1 | 1/2014 |
| JP | 5770905 B1 | 8/2015 |
| WO | WO 2014/192911 A1 | 12/2014 |

OTHER PUBLICATIONS

Japanese Office Action for corresponding application No. 2016-572130, dated May 21, 2018 (3 pgs).

English translation of International Preliminary Report on Patentability for PCT/JP2016/052435, dated Aug. 10, 2017 (2 pgs.).

English translation of Written Opinion of the International Searching Authority for PCT/JP2016/052435, dated Aug. 10, 2017 (5 pgs.).

* cited by examiner

FREE-STANDING SUBSTRATE, FUNCTION ELEMENT AND METHOD FOR PRODUCING SAME

This is a continuation of International Application No. PCT/JP2016/052435, filed Jan. 28, 2016, which claims the benefit of U.S. Provisional Application No. 62/109,179, filed Jan. 29, 2015, both of which are hereby incorporated by reference herein in their entirety.

FIELD OF THE INVENTION

The present invention relates to a self-supporting substrate, a functional element and a method of producing the same.

BACKGROUND ARTS

It has been proposed a method of forming a seed crystal of gallium nitride on an orientated polycrystalline substrate and then forming a thick film of gallium nitride, so that a self-supporting substrate of polycrystalline gallium nitride composed of a plurality of gallium nitride-based single crystal grains is produced, each having a single crystal structure substantially in a direction of normal lime (Patent documents 1 and 2).

Further, in producing a crystal of a nitride of a group 13 element by a flux method in a melt, it is proposed to generate the melt by heating a raw material of a group 13 element, a material of at least one of an alkali metal and an alkaline earth metal, and a liquid material of germanium (Patent document 3).

CITATION LIST

Patent Documents

Patent Document 1: WO 2014-192911 A1
Patent Document 2: Patent No. 5770905B
Patent Document 3: Patent No. 5396569B

SUMMARY OF THE INVENTION

When GaN is grown on an oriented polycrystalline substrate by the Na flux method, or when GaN is grown by the Na flux method after a GaN seed crystal layer having a thickness of several microns on the oriented polycrystalline substrate, the crystal quality of the GaN is substantially affected by the quality of the oriented polycrystalline substrate and idiomorphic tends to occur during the crystal growth. It was thus proved that irregularities or voids tend to occur on the surface. Further, when GaN is grown on the oriented polycrystalline substrate by Na flux method, it was found that the oriented polycrystalline substrate is deteriorated. In addition to this, as the growth rate of the Na flux method is low, it takes a long time for obtaining a thick film.

On the other hand, in the case that a thick film of GaN is formed on the oriented polycrystalline substrate by HVPE (hydride vapor deposition) method, it was found that the distribution of the dislocation density of GaN crystals tends to be deviated.

An object of the present invention is to provide a self-supporting substrate composed of a nitride such as gallium nitride, in which the deviation of the dislocation density on a surface of the self-supporting substrate can be reduced, voids on the surface can be prevented and its productivity can be improved.

The present invention provides a self-supporting substrate comprising:

a first nitride layer grown by a hydride vapor deposition method or an ammonothermal method and comprising a nitride of one or more element selected from the group consisting of gallium, aluminum and indium; and a second nitride layer grown by a sodium flux method on said first nitride layer and comprising a nitride of one or more elements selected from the group consisting of gallium, aluminum and indium;

wherein said first nitride layer comprises a plurality of single crystal grains arranged therein and being extended between a pair of main faces of said first nitride layer;

wherein said second nitride layer comprises a plurality of single crystal grains arranged therein and being extended between a pair of main faces of said second nitride layer; and wherein said first nitride layer has a thickness larger than a thickness of said second nitride layer.

According to the present invention, in the self-supporting substrate composed of a specific nitride such as gallium nitride, it becomes possible to reduce the deviation of the dislocation density on the surface of the self-supporting substrate, to prevent the voids on the surface and to improve the productivity.

EMBODIMENTS FOR CARRYING OUT THE INVENTION

Figure 1:
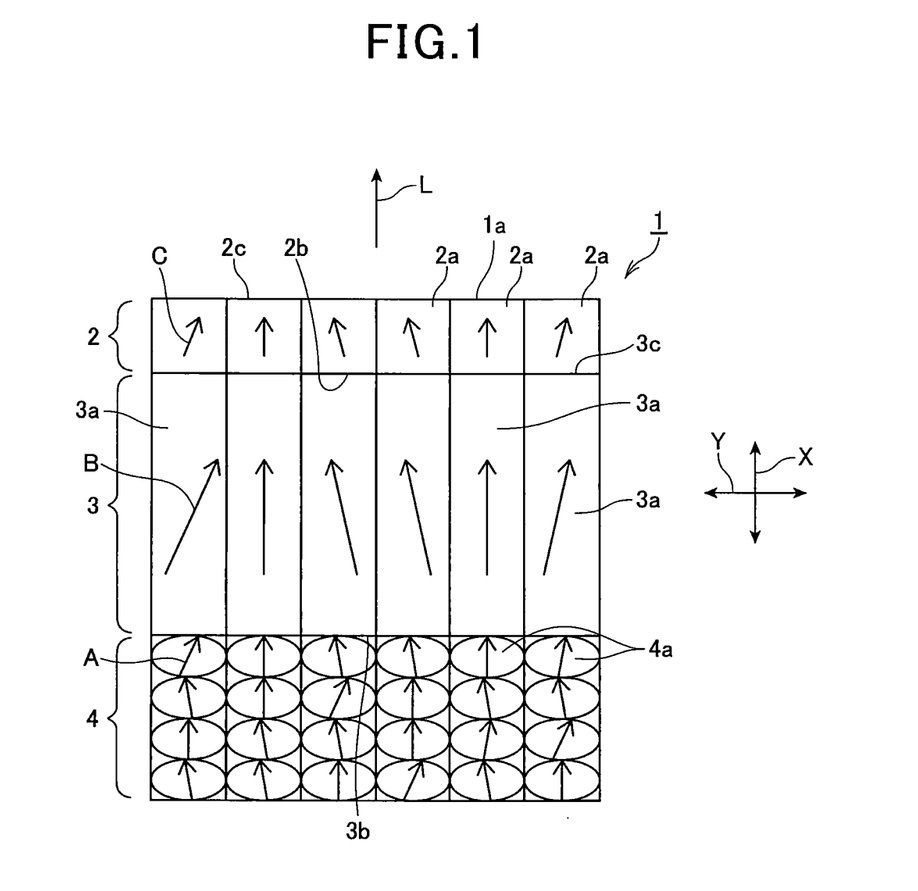
FIG. 1 is a diagram schematically showing a self-supporting substrate 1 composed of an oriented polycrystalline substrate 4, a first nitride layer 3 and a second nitride layer 2.

As shown in FIG. 1, in an oriented polycrystalline sintered body 4, the crystal orientations of the respective crystal grains are approximately oriented in a preferential crystal orientation and are slightly inclined with respect to the preferential crystal orientation.

On the oriented polycrystalline sintered body 4, by hydride vapor deposition or an ammonothermal method, it is provided a first nitride layer 3 made of a nitride of one or more element selected from the group consisting of gallium, aluminum and indium. The nitride may be gallium nitride, indium nitride, aluminum nitride or the mixed crystals thereof.

In the nitride layer 3, the respective crystal grains 3a are extended from a lower main face 3b to an upper main face 3c of the nitride layer 3 to penetrate through the nitride layer. The direction in which the respective crystal grains are extended is a direction X substantially normal to the thickness of the self-supporting substrate. Then, the respective crystal grains 3a are arranged in a direction Y (parallel to the plane) approximately normal to the thickness direction X of the self-supporting substrate. The respective grains 3a of nitride single crystal communicate from the main face 3c to the main face 3b of the first nitride layer 3 without intervening grain boundaries.

A second nitride layer 2 is grown on the first nitride layer 3 by a sodium flux method. The second nitride layer is also composed of a nitride of one or more elements selected from the group consisting of gallium, aluminum and indium.

In the nitride layer 2, the respective crystal grains 2a are extended from a lower main face 2b to an upper main face 2c of the nitride layer 2 to penetrate through the nitride layer. The direction in which the respective crystal grains are extended is a direction X substantially normal to or thickness of the self-supporting substrate. Then, the respective crystal grains 2a are arranged in a direction Y (parallel to the plane) approximately normal to the thickness direction X of the self-supporting substrate. The respective grains 2a of nitride single crystal are communicated from the main face 2c to the main face 2a of the second nitride layer 2 without intervening grain boundaries.

According to the present invention, in each of the nitride layers, the respective crystal grains have a crystal orientation that is mostly aligned in the direction approximately normal to the self-supporting substrate (normal-to-plane direction of the self-supporting substrate). This is not necessarily limited to a crystal orientation that is completely aligned in the direction normal to the substrate, and means that it may be a crystal orientation that is, to some extent, in alignment with the normal or a direction similar thereto as long as the desired device properties of devices such as light emitting devices including the self-supporting substrate can be ensured. Using an expression derived from the production method, it can also be said that the single crystal grains have a structure in which the grains are grown mostly in conformity with the crystal orientation of an oriented polycrystalline sintered body used as a base substrate in producing the self-supporting gallium nitride substrate.

The "structure in which grains are grown mostly in conformity with the crystal orientation of an oriented polycrystalline sintered body" means a structure resulting from crystal growth influenced by the crystal orientation of the oriented polycrystalline sintered body, is not necessarily limited to a structure in which grains are grown completely in conformity with the crystal orientation of the oriented polycrystalline sintered body, and may be a structure in which grains are grown, to some extent, in conformity with the crystal orientation of the oriented polycrystalline sintered body as long as the desired device properties of devices such as light emitting devices including the self-supporting substrate can be ensured. That is, this structure also includes a structure in which grains are grown in a crystal orientation different from that of the oriented polycrystalline sintered body. In this sense, the expression "structure in which grains are grown mostly in conformity with crystal orientation" can be paraphrased as "structure in which grains are grown in a manner mostly derived from crystal orientation".

Figure 2:
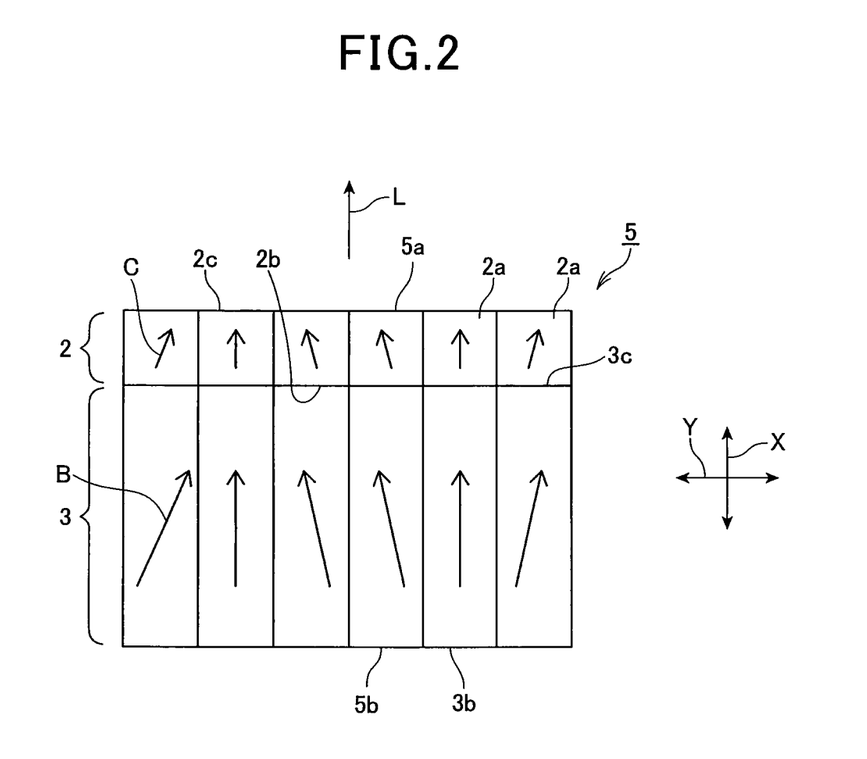
FIG. 2 is a diagram schematically showing a self-supporting substrate 5 composed of the first nitride layer 3 and second nitride layer 2.

Each of the nitrides is an aggregate of single crystal grains which are observed as single crystals viewed in the direction X normal to the main face 1a, 5a or 5b of the self-supporting substrate 1 or 5 and in which grain boundaries are observed viewed in the cross section cut along the plane-parallel direction Y (refer to FIGS. 1 and 2). Each of the single crystal grains typically has an elongate shape and more typically a columnar structure. However, the "columnar structure" does not mean only a typical vertically long columnar shape, and is defined as having a meaning encompassing various shapes such as a horizontally long shape, a trapezoidal shape, and an inverted trapezoidal shape. As described above, the self-supporting polycrystalline substrate may have a structure with a crystal orientation that is, to some extent, in alignment with the normal or a direction similar thereto, and does not necessarily need to have a columnar structure in a strict sense.

Further, in each of the nitride layers, it is not necessary that all of the single crystal grains are extended between the main faces of each nitride layer without intervening the grain boundaries, and a part of the single crystal grains may be terminated halfway of the nitride layer.

The oriented polycrystalline sintered body is composed of a sintered body that contains numerous single crystal grains which are to some extent highly oriented in a certain direction. The use of a polycrystalline sintered body oriented in this way makes it possible to produce a self-supporting polycrystalline substrate having a crystal orientation that is mostly aligned in the direction approximately normal to the substrate, and when the nitride layer is formed on the self-supporting polycrystalline substrate by epitaxial growth or crystal growth similar thereto, a state in which the crystal orientation is mostly aligned in the direction approximately normal to the substrate is achieved.

According to a preferred embodiment, the oriented polycrystalline sintered body is composed of a metal oxide or a metal nitride, and may more preferably be an oriented polycrystalline alumina sintered body.

Further, according to a preferred embodiment, the oriented polycrystalline sintered body has a transparency.

The direction in which the crystals are oriented in the oriented polycrystalline alumina sintered body is not particularly limited, and it may be the direction of a c-plane, an a-plane, an r-plane, an m-plane, or the like, and from the viewpoint of lattice constant matching with the self-supporting gallium nitride substrate, it is preferable that the crystals are oriented along the c-plane. As for the degree of orientation, for example, the degree of orientation at the plate surface is preferably 50% or greater, more preferably 65% or greater, even more preferably 75% or greater, particularly preferably 85% or greater, particularly more preferably 90% or greater, and most preferably 95% or greater. The degree of orientation can be determined by measuring an XRD profile through irradiating the plate surface of plate-shaped alumina with X rays using an XRD apparatus (such as RINT-TTR III manufactured by Rigaku Corporation) and calculating according to the formulae below.

$$\text{Degree of Orientation }[\%]=[(P-P_0)/(1-P_0)]\times 100 \quad \text{(Formula 1)}$$

$P_0=I_0\text{ (hkl)}/\Sigma I_0\text{ (hkl)}$ $p=I_s\text{ (hkl)}/\Sigma I_s\text{ (hkl)}$ ($I_0$(hkl) and $I_s$(hkl) are the integral values (2θ=20-70.degrees) of the diffraction intensities from the (hkl) plane in ICDD No. 461212 and a sample, respectively.

The grain diameter at the plate surface of grains constituting the oriented polycrystalline sintered body is preferably 0.3 to 1000 μm, more preferably 3 to 1000 μm, even more preferably 10 to 200 μm, and particularly preferably 14 to 200 μm.

The self-supporting substrate of the present invention includes at least the first and second nitride layers. According to the present invention, the "self-supporting substrate"

means a substrate that does not become deformed or damaged by its own weight when handled and that can be handled as solid matter.

The self-supporting substrate 1 may include the oriented polycrystalline sintered body 4, as shown in FIG. 1. However, preferably, as shown in FIG. 2, the oriented polycrystalline sintered body 4 is removed to obtain the self-supporting substrate 5 composed of the first nitride layer and second nitride layer.

A method for removing the oriented polycrystalline sintered body is not particularly limited, and examples include grinding, chemical etching, interfacial heating by laser irradiation from the oriented sintered body side (laser lift-off), spontaneous separation utilizing a difference in thermal expansion induced by the temperature rise and the like.

Figure 3A:
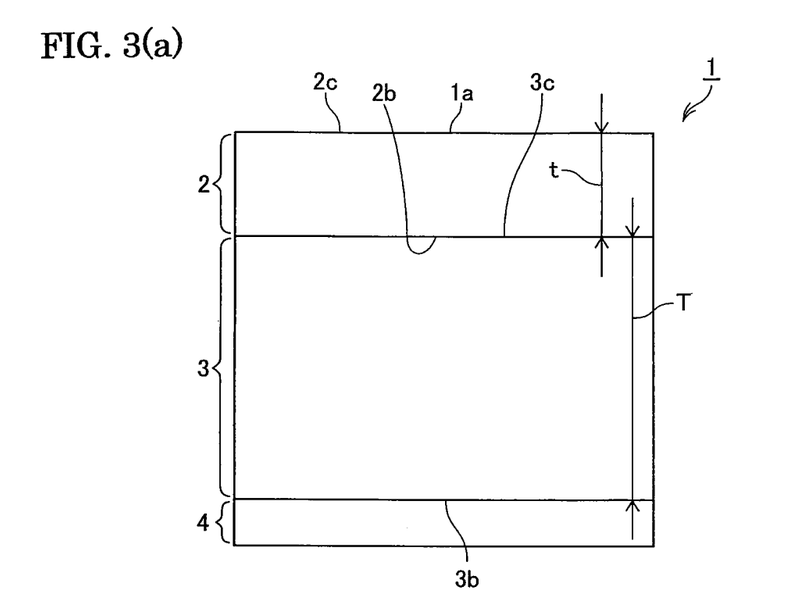
FIG. 3(a) is a diagram schematic showing a self-supporting substrate 1 composed of the oriented polycrystalline substrate 4, first nitride layer 3 and second nitride layer 2.
Figure 3B:
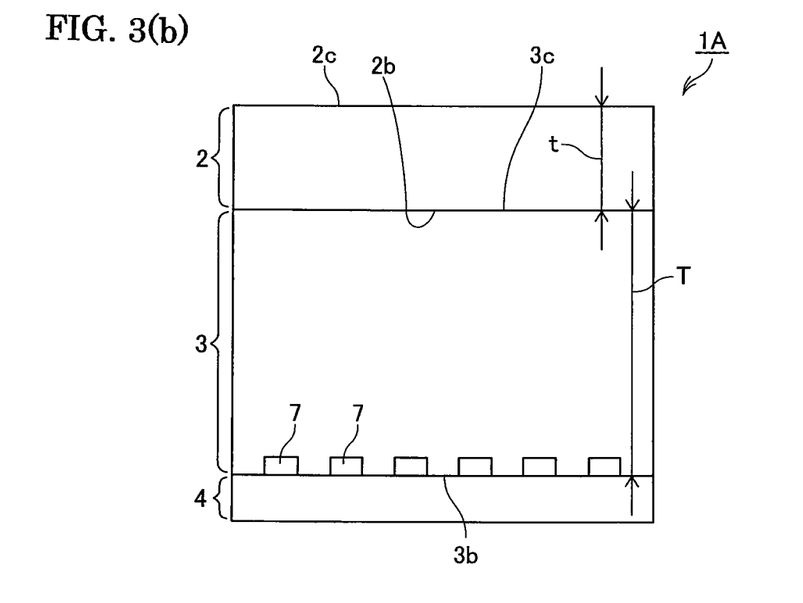
FIG. 3(b) is a diagram schematically showing a self-supporting substrate 1A obtained by providing a mask 7 for selective growth on the oriented polycrystalline substrate 4 and by then forming the first nitride layer 3 and second nitride layer 2 thereon.
Figure 4A:
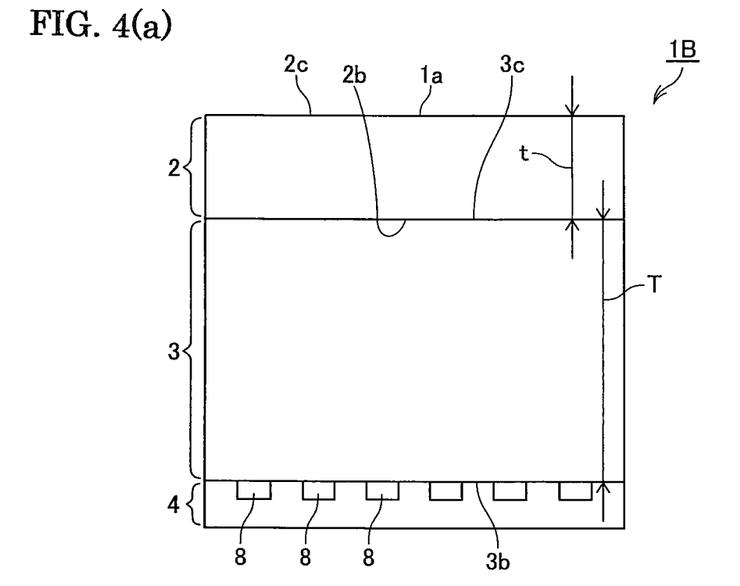
FIG. 4(a) is a diagram schematically showing a self-supporting substrate 1B obtained by providing processed portions 8 on the oriented polycrystalline substrate 4 and by then forming the first nitride layer 3 and second nitride layer 2 thereon.

As shown in FIGS. 3(a), 3(b) and 4(a), provided that "T" is assigned to the thickness of the first nitride layer and "t" is assigned to the thickness of the second nitride layer, T is made larger than t. It is thereby possible to reduce the deviation of the dislocation density on the surface 2c of the second nitride layer. On the viewpoint, T/t may preferably be made 2 or more and most preferably be made 4 or more.

On the other hand, if T/t becomes too large, the dislocation density on the surface (exposed face) of the second nitride layer tends to be large as a whole. Thus, on the viewpoint of lowering the dislocation density on the surface of the second nitride layer as a whole, T/t may preferably be made 100 or smaller and more preferably be made 10 or smaller.

Further, on the viewpoint of lowering the dislocation density on the surface (exposed face) of the second nitride layer, the thickness "t" of the second nitride layer may preferably be 10 μm or larger and more preferably be 50 μm or larger. However, on the viewpoint of productivity of the second nitride layer, the thickness of the second nitride layer may preferably be 200 μm or smaller and more preferably be 150 μm or smaller.

As the first nitride layer is formed by hydride vapor deposition or an ammonothermal method, its growth rate is large, and even when the oriented polycrystalline substrate is deteriorated, it may be peeled off from the substrate, after the growth of the thick film.

As the second nitride layer does not include a region with the dislocations concentrated and exhibit a deviation in the distribution of the dislocation density, so that it is possible to prevent the deviation of the dislocation at the surface of the self-supporting substrate. Then, by making the thickness of the first nitride layer with the larger growth rate relatively large, it is possible to obtain the strength required for the self-supporting substrate.

According to a preferred embodiment, the thickness "T" of the first nitride layer is made 100 μm or larger so that a higher strength can be obtained. On the viewpoint, the thickness "T" of the first nitride layer may more preferably be made 200 μm or larger.

According to a preferred embodiment, in the first nitride layer 3, the single crystal grains 3a have the crystal orientation B which is mostly aligned with respect to the direction approximately normal to the substrate, and in the second nitride layer 2, the single crystal grains 2a have the crystal orientation C which is mostly aligned with respect to the direction approximately normal to the substrate.

The crystal orientation B of each single crystal grain 3a in the first nitride layer 3 is mostly aligned with respect to the crystal orientation A of the crystal grain 4a in the uppermost layer of the oriented polycrystalline substrate. Further, the crystal orientation C of each single crystal grain 2a in the second nitride layer 2 is mostly aligned with respect to the crystal orientation B of the crystal grain 3a in the first nitride layer 3.

In this case, more preferably, the crystal orientations B, C of individual single crystal grains as determined from inverse pole figure mapping by electron backscatter diffraction (EBSD) analysis performed on the surface of the self-supporting substrate are distributed with various tilt angles from a specific crystal orientation L, and the average tilt angle is 1 to 10°. A preferred specific crystal orientation L is c-plane or m-plane.

Further, more preferably, the crystal orientations B, C of individual single crystal grains as determined from inverse pole figure mapping by electron backscatter diffraction analysis performed on the surface of the self-supporting substrate make an angle of 5° or smaller with respect to the direction X normal to the plane (thickness direction).

Further, according to a preferred embodiment, the resistivity of the first nitride layer is lower than the resistivity of the second nitride layer. According to a more preferred embodiment, the resistivity of the first nitride layer is 30 mΩ·cm or lower.

Doping at a high concentration can be performed by hydride vapor deposition or an ammonothermal method than by a sodium flux method, so that the nitride layer having a lower resistance can be formed. Thus, the first nitride layer whose thickness is larger than that of the second nitride layer can be made lower in resistance, so that the whole resistance of the self-supporting substrate can be made lower.

Each of the nitrides forming the respective nitride layers of the self-supporting gallium nitride substrate may be free from a dopant. Here, the phrase "free from a dopant" means that an element that is added to impart a certain function or property is not contained, but, needless to say, inevitable impurities are allowed.

Alternatively, each of the nitride layers forming the self-supporting substrate may be doped with an n-type dopant or a p-type dopant. In this case, the self-supporting substrate may be used as a component or a layer other than a substrate, such as a p-type electrode, an n-type electrode, a p-type layer, or an n-type layer.

Preferred examples of p-type dopants include one or more selected from the group consisting of beryllium (Be), magnesium (Mg), calcium (Ca), strontium (Sr), zinc (Zn), and cadmium (Cd). Preferable examples of n-type dopants include one or more selected from the group consisting of silicon (Si), germanium (Ge), tin (Sn), and oxygen (O).

Preferably, the cross-sectional average diameter of the single crystal grains at the outermost surface 2c of the self-supporting substrate is 0.3 μm or greater, more preferably 3 μm or greater, even more preferably 20 μm or greater, yet more preferably 50 μm or greater, particularly preferably 70 μm or greater. Although the upper limit of the cross-sectional average diameter of the single crystal grains at the outermost surface of the self-supporting substrate is not particularly limited, it is realistically 1000 μm or less, more realistically 500 μm, and even more realistically 200 μm or less.

The average grain diameter at the surface of the nitride layer of the crystal grains is measured by the following method. That is, the plate surface of a plate-shaped sintered body is polished, and an image is taken with a scanning electron microscope. The visual field range is determined in a way such that when straight lines are diagonally drawn on the obtained image, each straight line crosses 10 to 30 grains. The average grain diameter at the plate surface is determined by diagonally drawing two straight lines on the obtained image, taking the average of the line segment lengths inside all grains crossed by the straight lines, and multiplying the average by 1.5. When the boundary of the sintered body grains cannot be clearly determined on the scanning microscope image of the plate surface, the above evaluation may be carried out after performing processing to emphasize the boundary by thermal etching (for example, for 45 minutes at 1550° C.) or chemical etching.

It is preferable that the self-supporting substrate has a size of 50.8 mm (2 inches) or greater in diameter, more preferably 100 mm (4 inches) or greater in diameter, and even more preferably 150 mm (6 inches) or greater in diameter.

It is preferable that the self-supporting substrate is circular or substantially circular as viewed from above, but the shape is not limited thereto. In the case where the self-supporting substrate is not circular or substantially circular, the area is preferably 2026 $mm^2$ or greater, more preferably 7850 $mm^2$ or greater, and even more preferably 17661 $mm_2$ or greater. For applications that do not require a large area, the area may be smaller than the above range such as 50.8 mm (2 inches) or less in diameter, or 2026 $mm^2$ or less in terms of area.

The thickness of the self-supporting substrate needs to be capable of imparting self-supporting properties to the substrate, and is thus preferably 20 μm or greater, more preferably 100 μm or greater, and even more preferably 300 μm or greater. Although the upper limit of the thickness of the self-supporting substrate should not be specified, the thickness is realistically 3000 μm or less from the viewpoint of production cost.

The present invention further provides a functional device comprising the self-supporting substrate and a functional layer comprising a semiconductor formed on the self-supporting substrate.

The self-supporting substrate of the present invention is usable as a substrate for various semiconductor devices such as light emitting devices, and, in addition, it is usable as a component or a layer other than a substrate, such as an electrode (which may be a p-type electrode or an n-type electrode), a p-type layer, or an n-type layer.

According to a preferred embodiment, the single crystal grains constituting the semiconductor have a crystal orientation which grown mostly aligned with the preferential crystal orientation of the self-supporting substrate.

Further, according to a preferred embodiment, the semiconductor forming the functional layer is composed of a nitride of one or more elements selected from the group consisting of gallium, aluminum and indium.

Further, as shown in FIG. 3(a), according to the method of the invention, the first nitride layer 3 is grown by hydride vapor deposition or an ammonothermal method, so that it has a preferential crystal orientation mostly aligned with the preferential crystal orientation of the oriented polycrystalline sintered body 4. Then, the second nitride layer 2 is formed on the first nitride layer 3 by a sodium flux method so that the second nitride layer 2 has a preferential crystal orientation mostly aligned with the preferential crystal orientation of the first nitride layer 3. At this time, the thickness "T" of the first nitride layer 3 is made larger than the thickness "t" of the second nitride layer 2.

Figure 4B:
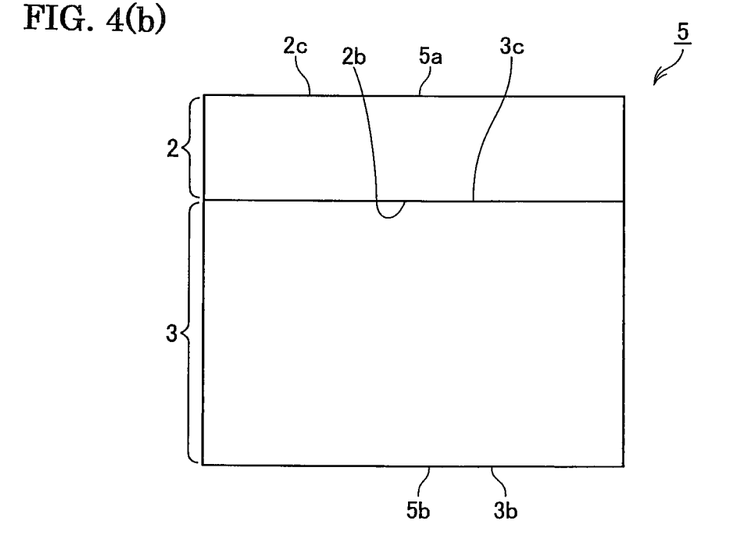
FIG. 4(b) is a diagram schematically showing a self-supporting substrate 5 composed of the first nitride layer 3 and second nitride layer 2.

According to a preferred embodiment, as shown in FIG. 4(b), the oriented polycrystalline sintered body 4 is removed from the first nitride layer 3.

Further, according to a preferred embodiment, as shown in FIG. 3(b), a selective growth mask 7 is formed on the orientated polycrystalline sintered body 4.

Then, the first nitride layer 3 is grown by hydride vapor deposition or ammonothermal method so that it has the preferential crystal orientation mostly aligned with the preferential crystal orientation of the oriented polycrystalline sintered body 4. Then, the second nitride layer 2 is grown on the first nitride layer 3 by sodium flux method so that it has the preferential crystal orientation mostly aligned with the preferential crystal orientation of the first nitride layer. The self-supporting substrate 1A is thus obtained.

Then, according to a preferred embodiment, as shown in FIG. 4(b), the oriented polycrystalline sintered body 4 and selective growth mask are removed from the first nitride layer 3.

By forming the selective growth mask on the oriented sintered body, in the case that the first nitride layer is formed by hydride vapor deposition or an ammonothermal method, the deviation of the distribution of the dislocation density can be reduced. The deviation of the dislocation density can be further reduced as a whole of the finally obtained self-supporting substrate. Further, the peeling of the oriented sintered body can be facilitated utilizing the difference of the thermal expansion.

Further, according to a preferred embodiment, as shown in FIG. 4(a), the surface of the oriented polycrystalline sintered body 4 is processed. 8 represents the thus processed portions, which are grooves or recessed.

Then, the first nitride layer 3 is grown by hydride vapor deposition or an ammonothermal method, so that it has a preferential crystal orientation mostly aligned with the preferential crystal orientation of the oriented polycrystalline sintered body 4. Then, the second nitride layer 2 is formed on the first nitride layer 3 by a sodium flux method so that the second nitride layer 2 has a preferential crystal orientation mostly aligned with the preferential crystal orientation of the first nitride layer 4. The self-supporting substrate 1B is thus obtained.

According to a preferred embodiment, as shown in FIG. 4(b), the oriented polycrystalline sintered body 4 is removed from the first nitride layer.

By providing the processed portions on the oriented polycrystalline sintered body, in the case that the first nitride layer is formed by hydride vapor deposition or an ammonothermal method, the deviation of the distribution of the dislocation density can be reduced. The deviation of the dislocation density can be further reduced as a whole of the finally obtained self-supporting substrate. Further, the peeling of the oriented sintered body can be facilitated utilizing the difference of the thermal expansion.

Further, according to the present invention, after the self-supporting substrate is produced, the functional layer of the semiconductor is provided on the self-supporting substrate so that it has the preferential crystal orientation mostly aligned with the preferential crystal orientation of the self-supporting substrate.

According to a preferred embodiment, the functional layer has the function of light emission, rectification or control of electric power.

When the second nitride layer is formed by a sodium flux method, it is contained as a germanium compound which is liquid at 25° C. and under atmospheric pressure. The in-plane distribution of the dislocation density can be considerably reduced.

The nitride of the group 13 element grown by a sodium flux method emits a fluorescence (blue fluorescence) having a peak in 440 to 470 nm when light having a wavelength of 350 nm or lower (for example, light of a mercury lamp) is irradiated. On the other hand, the nitride of the group 13 element grown by hydride vapor deposition or an ammonothermal method emits a fluorescence (yellow fluorescence)

having a peak in 540 to 580 nm when light having a wavelength of 350 nm or lower (for example, light of a mercury lamp) is irradiated. Thus, by the color of the fluorescence emitted upon irradiating the light of a wavelength of 350 nm or lower, it is possible to distinguish the nitrides of the group 13 element obtained by a sodium flux method and by hydride vapor deposition or an ammonothermal method.

EXAMPLES

Example 1

(Production of c-Plane Oriented Alumina Sintered Body)

As a raw material, a plate-shaped alumina powder (manufactured by Kinsei Matec Co., Ltd., grade 00610) was provided. 7 parts by weight of a binder (polyvinyl butyral: lot number BM-2, manufactured by Sekisui Chemical Co., Ltd.), 3.5 parts by weight of a plasticizer (DOP: di(2-ethylhexyl) phthalate, manufactured by Kurogane Kasei Co., Ltd.), 2 parts by weight of a dispersing agent (Rheodol SP-030, manufactured by Kao Corporation), and a dispersion medium (2-ethylhexanol) were mixed with 100 parts by weight of the plate-shaped alumina particles. The amount of the dispersion medium was adjusted so that the slurry viscosity was made 20000 cP. The slurry prepared as above was formed into a sheet on a PET film by a doctor blade method so as to have a dry thickness of 20 μm. The resulting tape was cut into circles having a diameter of 50.8 mm (2 inches), then 150 pieces were stacked and placed on an Al plate having a thickness of 10 mm, and then vacuum packing was performed. This vacuum pack was subjected to isostatic pressing in hot water at 85° C. under a pressure of 100 kgf/cm$^2$, and a disc-shaped green body was obtained.

The resulting green body was placed in a degreasing furnace and degreased at 600° C. for 10 hours. The resulting degreased body was fired in a hot press at 1600° C. for 4 hours under a surface pressure of 200 kgf/cm$^2$ in nitrogen using a graphite mold. The resulting sintered body was re-fired at 1700° C. for 2 hours under a gas pressure of 1500 kgf/cm$^2$ in argon in a hot isostatic press (HIP).

The sintered body obtained in this way was fixed to a ceramic surface plate and ground to #2000 using a grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of the abrasive grains from 3 μm to 0.5 μm in a stepwise manner. The average roughness Ra after processing was 1 nm.

(Evaluation of Degree of Orientation of Oriented Alumina Substrate)

For confirming the degree of orientation of the thus obtained oriented alumina sintered body, by XRD (X-ray diffraction), which measured the degree of orientation of the c-plane, which is a crystal plane to be measured according to the present experimental example. The XRD apparatus (RINT-TTR III manufactured by Rigaku Corporation) was used and X-rays were irradiated to the substrate plane of the oriented alumina substrate to measure the XRD profile in a range of 2θ=20 to 70°. The degree of orientation of the c-plane was calculated according to the formula (1) described above. As a result, the degree of orientation of the c-plane was proved to be 97 percent according to the present experimental example.

(Evaluation of Grain Size of Grains of Sintered Body of Oriented Alumina Substrate)

The average grain diameter at the surface of the oriented alumina substrate was measured by the following method. The plate surface of the thus obtained oriented alumina substrate was polished and subjected to thermal etching at 1550° C. for 45 minutes, and an image was taken with a scanning electron microscope. The visual field range is determined in a way such that when straight lines are diagonally drawn on the obtained image, each straight line crosses 10 to 30 grains. The average grain diameter at the plate surface was determined by diagonally drawing two straight lines on the obtained image, taking the average of the line segment lengths inside all grains crossed by the straight lines, and multiplying the average by 1.5. As a result, the average grain size at the plate surface was proved to be 100 μm.

(Film Formation of Gallium Nitride Layer by Hydride Vapor Deposition Method)

The substrate produced according to the above steps was contained in an HVPE furnace, and hydrochloride (HCl) gas was reacted with gallium metal (Ga) on a source port heated at 800° C. to generate gallium chloride (GaCl) gas. The gallium chloride gas, ammonia (NH$_3$) gas as a raw material gas and hydrogen gas as a carrier gas were supplied onto the main surface of the oriented alumina substrate upon heating, to grow gallium nitride crystal on the substrate. In the crystal growth step, a buffer layer of gallium nitride was formed in a thickness of 40 nm on the oriented alumina substrate heated at 550° C., and the temperature was raised to 1100° C. to form a thick film of the gallium nitride layer. The growth rate was about 200 μm/hours and the time period of the growth was adjusted depending on the designed film thickness to obtain a desired film thickness. In the thus obtained sample, gallium nitride crystal was grown over the whole main surface of the substrate having a diameter of 50.8 mm (2 inches), and cracks were not observed.

(Film Formation of Ge-Doped Gallium Nitride Layer by Sodium Flux Method)

The substrate produced by the steps described above was placed on the bottom of a cylindrical, flat-bottomed alumina crucible having an inner diameter of 80 mm and a height of 45 mm, and then the crucible was filled with a melt composition in a glovebox. The composition of the melt composition was as follows.

Metal Ga: 60 g
Metal Na: 60 g
Germanium tetrachloride: 1.85 g

This alumina crucible was put in a vessel made of a refractory metal and sealed, and then placed on a rotatable rack of a crystal growth furnace. After the temperature and the pressure were raised to 870° C. and 4.0 MPa in a nitrogen atmosphere, the melt was maintained for 30 hours while being rotated and stirred, and gallium nitride crystals were allowed to grow. The retention time was adjusted depending on a desired thickness so as to obtain the desired thickness. After the end of crystal growth, the growth vessel was cooled slowly back to room temperature for 3 hours, and then the growth vessel was taken out from the crystal growth furnace. The melt composition remaining in the crucible was removed using ethanol, and a sample in which gallium nitride crystals grew was recovered. In the resulting sample, Ge-doped gallium nitride crystals grew on the entire surface of the 50.8 mm (2 inches) seed crystal substrate, and the crystal growth rate was about 10 μm/h. No cracks were observed.

(Removal and Surface Processing of Oriented Alumina Substrate)

The oriented alumina substrate portion of the sample obtained in this way was removed by grinding with grinding wheel to obtain a self-supporting substrate of gallium nitride. The plate surface of the self-supporting substrate was polished by grinding wheels of #600 and #2000 to flatten the plate surface. Then, the plate surface was smoothed by lapping using diamond abrasive grains to obtain a self-supporting substrate of gallium nitride having a thickness of about 400 μm Flatness was improved by reducing the size of the abrasive grains from 3 μm to 0.1 μm in a stepwise manner. Finally, reactive ion etching was performed to remove processing deformation layer to finish the self-supporting substrate. The self-supporting substrate after the processing had an average roughness Ra of 0.2 nm.

(Measurement of Dislocation Density and Voids)

The defect density was determined by counting the number of dark spots on the uppermost surface of the thus obtained self-supporting substrate by cathode luminescence (CL). The observed visual field was shifted depending on the number of dark spots observed, the visual fields were divided into 16 fields of 4 rows and 4 columns, and the maximum and minimum values of the dislocation density were compared to evaluate the deviation of distribution of dislocation density. Further, the average value of the dislocation density was calculated. Further, it was observed the presence or absence of voids having a size of 30 μm or larger on the uppermost surface by a differential interference contrast microscope.

Besides, samples A to D were produced as shown in table 1, and the above experiment was carried out for each of the samples. Simultaneously, in the above experiment, the first nitride layer was formed by a hydride vapor deposition method and the second nitride layer was not formed to provide a sample E. Further, the first nitride layer was not formed by a hydride vapor deposition method and only the second nitride layer was formed by a sodium flux method to provide a sample F. Further, in the samples A to F, a total value of the thickness of the first nitride layer and the thickness of the second nitride layer was determined as 400 μm.

where the first nitride layer was not formed and only the second nitride layer was formed by a Na flux method, although the deviation of the dislocation density was small and the average value of the dislocation density was low, voids were observed on the surface.

Contrary to this, according to the inventive examples (samples A to D), the deviation of the dislocation density was prevented and voids were not observed on the surface.

Example 2

The self-supporting substrate was produced according to the same procedure as the sample C of the example 1.

However, contrary to example 1, when the first nitride layer composed of gallium nitride crystal was formed by hydride vapor deposition, the flow rate of silicon tetrafluoride ($SiF_4$) gas was adjusted so that Si was doped at a dope amount of $2 \times 10^{19}$ $cm^{-3}$. Further, when the second nitride layer of gallium nitride layer was formed by a sodium flux method, germanium tetrachloride was used as a dopant.

The thus obtained self-supporting substrate was subjected to measurement of the volume resistivity by hall effect measurement. It was proved to be n-type and the volume resistivity was 7 mΩ·cm.

Example 3

The self-supporting substrate was produced according to the same procedure as the sample C of the example 1.

However, contrary to example 1, when the first nitride layer composed of gallium nitride crystal was formed by hydride vapor deposition, Mg was doped. Further, when the second nitride layer of gallium nitride layer was formed by a sodium flux method, Mg was doped.

The thus obtained self-supporting substrate was subjected to measurement by hall effect measurement. It was proved to be p-type.

Example 4

The self-supporting substrate was produced according to the same procedure as the sample C of example 1.

TABLE 1

|  | Sample A | Sample B | Sample C | Sample D | Sample E | Sample F |
|---|---|---|---|---|---|---|
| Thickness of second nitride layer t (μm) | 133 | 80 | 50 | 10 | 0 | 400 |
| Thickness of first nitride layer T (μm) | 267 | 320 | 350 | 390 | 400 | 0 |
| Ratio of thicknesses of layers T/t | 2.0 | 4.0 | 7.0 | 39.0 | — | 0 |
| Voids on surface | なし | なし | なし | なし | なし | あり |
| Maximum of dislocation density max ($cm^{-2}$) | $2.9 \times 10^2$ | $3.3 \times 10^3$ | $2.4 \times 10^4$ | $3.1 \times 10^5$ | $8.9 \times 10^8$ | $2.0 \times 10^2$ |
| Minimum of dislocation density min ($cm^{-2}$) | $8.9 \times 10$ | $2.9 \times 10^2$ | $5.8 \times 10^2$ | $3.6 \times 10^3$ | $1.7 \times 10^6$ | $6.7 \times 10$ |
| Maximun/minimum of dislocation density max/min | 3.3 | 11.4 | 41.4 | 86.1 | 523.5 | 3.0 |
| Average of dislocation density ($cm^{-2}$) | $1.8 \times 10^2$ | $1.6 \times 10^3$ | $6.9 \times 10^3$ | $7.9 \times 10^4$ | $5.0 \times 10^8$ | $1.3 \times 10^2$ |

As can be seen from the sample E, on the surface of the first nitride layer formed by a hydride vapor deposition method, the deviation of the dislocation density was large and the average value of the dislocation density was large, although the voids were not observed on the surface. On the other hand, as can be seen from the sample F, on the surface However, contrary to example 1, when the first nitride layer composed of gallium nitride crystal was formed by hydride vapor deposition, Zn was doped. Further, when the second nitride layer of gallium nitride layer was formed by a sodium flux method, Zn was used as a dopant.

The thus obtained self-supporting substrate was subjected to measurement of the volume resistivity by hall effect measurement. It was proved to be n-type, and the volume resistivity was $5×10^5$ Ω·cm, proving that its resistivity was higher.

Example 5

An LED (light emitting diode) structure was formed on the surface of the second nitride layer of the self-supporting substrate of the sample C obtained in the example 2.
(Formation of Light Emitting Function Layer by MOCVD Method)

It was formed an n-GaN layer having a thickness of 1 μm, on the self-supporting substrate as an n-type layer using MOCVD method (organic metal chemical vapor deposition) at 1050° C., so that it was doped with Si at an Si atom concentration of $5×10^{18}/cm^3$. Then, as the light-emitting layer, a multiple quantum well layer was formed at 750° C. Specifically, five 2.5 nm thick InGaN well layers and six 10 nm thick GaN barrier layers were alternately stacked. Then, a 200 nm thick p-GaN doped to give a Mg atom concentration of $1×10^{19}/cm^3$ was deposited at 950° C., as a p-type layer. Thereafter, the sample was taken out from the MOCVD apparatus, and 800° C. heat treatment was performed for 10 minutes in a nitrogen atmosphere as activation treatment of Mg ions of the p-type layer.
(Production of Light Emitting Device)

Using a photolithography process and a vacuum deposition method, Ti/Al/Ni/Au films as a cathode were patterned on the surface on the side opposite to the n-GaN layer and the p-GaN layer of the self-supporting substrate in a thickness of 15 nm, 70 nm, 12 nm, and 60 nm, respectively. Thereafter, to improve ohmic contact characteristics, heat treatment at 700° C. was performed in a nitrogen atmosphere for 30 seconds. Furthermore, using a photolithography process and a vacuum deposition method, Ni/Au films were patterned as a translucent anode on the p-type layer in a thickness of 6 nm and 12 nm, respectively. Thereafter, to improve ohmic contact characteristics, 500° C. heat treatment was performed in a nitrogen atmosphere for 30 seconds. Furthermore, using a photolithography process and a vacuum deposition method, Ni/Au films that served as an anode pad were patterned in a thickness of 5 nm and 60 nm, respectively, on a partial area of the top surface of the aforementioned Ni/Au films as a translucent anode. The wafer obtained in this way was cut into a chip and, further, furnished with a lead frame to obtain a light emitting device having a vertical structure.
(Evaluation of Light Emitting Device)

When electricity was applied across the cathode and the anode and I-V measurement was performed, the devices demonstrated rectifying characteristics. Moreover, with an electric current flowing in the forward direction, emission of light having a wavelength of 450 nm was confirmed.

Example 6

A functional device having a rectifying function was produced.

Specifically, a Schottky barrier diode structure was formed on the surface of the second nitride layer of the self-supporting substrate obtained in the example 2, as follows. The electrodes were then formed thereon to obtain a diode.

(Formation of Rectifying Function Layer by MOCVD Method)

It was formed an n-GaN layer having a thickness of 1 on, on the self-supporting substrate as an n-type layer using a MOCVD method (organic metal chemical vapor deposition) at 1050° C., so that it was doped with Si at an Si atom concentration of $1×10^{17}/cm^3$.
(Production of Rectifying Device)

Using a photolithography process and a vacuum deposition method, Ti/Al/Ni/Au films as a cathode were patterned on the surface on the side opposite to the n-GaN layer of the self-supporting substrate in thicknesses of 15 nm, 70 nm, 12 nm, and 60 nm, respectively. Thereafter, to improve ohmic contact characteristics, heat treatment at 700° C. was performed in a nitrogen atmosphere for 30 seconds. Furthermore, using a photolithography process and a vacuum deposition method, Ni/Au films were patterned as a Schottky electrode on the n-GaN layer formed by MOCVD method in a thickness of 6 nm and 80 nm, respectively. The wafer obtained in this way was cut into a chip and, further, furnished with a lead frame to obtain the rectifying device.
(Evaluation of Rectifying Device)

When the I-V measurement was performed, the rectifying characteristics were confirmed.

Example 7

It was produced a functional device having the function of controlling electric power.

A self-supporting substrate was produced as the sample C obtained in the example 1. However, different from the example 1, in producing the second nitride film composed of gallium nitride crystal by a Na flux method, the doping of the impurity was not performed. On the surface of the second nitride layer of the self-supporting substrate obtained in this way, it was produced HEMT structure of $Al_{0.3}Ga_{0.7}N/GaN$ by MOCVD method as follows to form an electrode, and the transistor characteristics were confirmed.
(Film Formation of Functional Layer of Controlling Electric Power by MOCVD Method)

Using MOCVD method (organic metal chemical vapor deposition), it was formed an n-GaN layer without the doping of the impurity in a thickness of 3 μm on the self-supporting substrate as an i-type layer at 1050° C. It was then produced the $Al_{0.3}Ga_{0.7}N$ layer as the functional layer in 25 nm at the same 1050° C. It was thus obtained the HEMT structure of $Al_{0.3}Ga_{0.7}N/GaN$.
(Production of Device Having Function of Controlling Electric Power)

Using a photolithography process and a vacuum deposition method, Ti/Al/Ni/Au films as a source and drain electrodes were patterned in thicknesses of 15 nm, 70 nm, 12 nm, and 60 nm, respectively. Thereafter, to improve ohmic contact characteristics, 700° C. heat treatment was performed in a nitrogen atmosphere for 30 seconds. Furthermore, using a photolithography process and a vacuum deposition method, Ni/Au films were patterned as a gate electrode by Schottky junction in thicknesses of 6 nm and 80 nm, respectively. The wafer obtained in this way was cut into a chip and, further, furnished with a lead frame to obtain the device having the function of controlling electric power.
(Evaluation of Device Having Function of Controlling Electric Power)

When the I-V measurement was performed, good pinch-off characteristics were confirmed, in which the maximum drain current was 800 mA/mm and maximum transconductance was 260 mS/mm.

Example 8

It was produced the self-supporting substrate same as the sample C of example 1.

However, different from example 1, after the oriented alumina sintered body was obtained, it was formed a mask made of SiO$_2$ and having a shape of a stripe on the surface. The width of the mask was made 250 μm and the width of the windows was made 25 μm.

On the surface of the thus obtained self-supporting substrate, the distribution of the dislocation density was calculated as the sample C. The ratio of the maximum dislocation density/minimum dislocation density was proven to be 20, so that the distribution of the dislocation density was reduced. Further, the average value of the dislocation density was 3.8×10$^3$ cm$^{-2}$.

Example 9

It was produced the self-supporting substrate same as the sample C of example 1.

However, different from example 1, after the oriented alumina sintered body was obtained, it was formed a mask made of SiO$_2$ and having a shape of a stripe on the surface. The width of the mask was made 100 μm and the width of the windows was made 100 μm. Then, the masked surface of the oriented alumina substrate was etched by 1 μm by reactive ion etching, and the mask was removed by BHF to form periodic grooves on the substrate surface.

On the surface of the thus obtained self-supporting substrate, the distribution of the dislocation density was calculated as the sample C. The ratio of the maximum dislocation density/minimum dislocation density was proven to be 36, so that the distribution of the dislocation density was reduced. Further, the average value of the dislocation density was 5.8×10$^3$ cm$^{-2}$.

What is claimed is:

1. A self-supporting substrate comprising:
a first nitride layer grown by a hydride vapor deposition method or an ammonothermal method and comprising a nitride of one or more elements selected from the group consisting of gallium, aluminum and indium; and
a second nitride layer grown by a sodium flux method on said first nitride layer and comprising a nitride of one or more elements selected from the group consisting of gallium, aluminum and indium;
wherein said first nitride layer comprises a plurality of single crystal grains arranged therein and extending between a pair of main faces of said first nitride layer;
said second nitride layer comprises a plurality of single crystal grains arranged therein and extending between a pair of main faces of said second nitride layer; and
said first nitride layer has a thickness larger than a thickness of said second nitride layer.

2. The self-supporting substrate of claim 1, wherein T/t is 2-100, provided that T is assigned to said thickness of said first nitride layer and t is assigned to said thickness of said second nitride layer.

3. The self-supporting substrate of claim 2, wherein T/t is 4-100.

4. The self-supporting substrate of claim 1, wherein said thickness of said first nitride layer is 100-20,000 μm.

5. The self-supporting substrate of claim 1, wherein each of said single crystal grains of said first nitride layer has a crystal orientation mostly aligned with a direction approximately normal to said substrate, and wherein each of said single crystal grains of said second nitride layer has a crystal orientation mostly aligned with a direction approximately normal to said substrate.

6. The self-supporting substrate of claim 1:
wherein crystal orientations of said single crystal grains as determined from inverse pole figure mapping by electron backscatter diffraction analysis performed on a surface of said self-supporting substrate are distributed with various tilt angles from a specific crystal orientation; and
wherein an average of said tilt angles is 1 to 10 degree.

7. The self-supporting substrate of claim 6, wherein said specific crystal orientation is of c-plane or m-plane.

8. The self-supporting substrate of claim 1, wherein said first nitride layer has a resistivity lower than a resistivity of said second nitride layer.

9. The self-supporting substrate of claim 8, wherein said resistivity of said first nitride layer is 30 mΩ·cm or lower.

10. The self-supporting substrate of claim 1, wherein said single crystal grains in the at least one of said first and second nitride layers are doped with an n-type dopant or a p-type dopant.

11. The self-supporting substrate of claim 1, wherein said single crystal grains in the at least one of said first and second nitride layers are free from a dopant.

12. The self-supporting substrate claim 1, wherein zinc is doped into said single crystal grains of said second nitride layer.

13. A functional device comprising said self-supporting substrate of claim 1, and a functional layer comprising a semiconductor and formed over said self-supporting substrate.

14. The functional device of claim 13, wherein each of single crystal grains in the at least one of said first and second nitride layers forming said semiconductor has a crystal orientation grown mostly aligned with a preferential crystal orientation of said self-supporting substrate.

15. The functional device of claim 13, wherein said semiconductor constituting said functional layer comprises a nitride of one or more elements selected from the group consisting of gallium, aluminum and indium.

16. The functional device of claim 13, wherein said functional layer has a function of emitting a light.

17. The functional device of claim 13, wherein said functional layer has a function of rectification.

18. The functional device of claim 13, wherein said functional layer has a function of controlling an electric power.

19. A method of producing a functional device, said method comprising the step of:
providing a functional layer comprising a semiconductor on said self-supporting substrate of claim 1, so that said semiconductor has a preferential crystal orientation mostly aligned with a preferential crystal orientation of said self-supporting substrate.

20. The method of claim 19, wherein said semiconductor forming said functional layer comprises a nitride of one or more elements selected from the group consisting of gallium, aluminum and indium.

21. The method of claim 19, wherein said functional layer has a function of emitting a light.

22. The method of claim 19, wherein said functional layer has a function of rectification.

23. The method of claim 19, wherein said functional layer has a function of controlling an electric power.

24. A method of producing a self-supporting substrate, said method comprising the steps of:

growing a first nitride layer on an oriented polycrystalline sintered body by a hydride vapor deposition method or ammonothermal method so that said first nitride layer has a preferential crystal orientation mostly aligned with a preferential crystal orientation of said oriented polycrystalline sintered body, said first nitride layer comprising a nitride of one or more elements selected from the group consisting of gallium, aluminum and indium; and growing a second nitride layer by a sodium flux method on said first nitride layer so that said second nitride layer has a preferential crystal orientation mostly aligned with said preferential crystal orientation of said first nitride layer, said second nitride layer comprising a nitride of one or more elements selected from the group consisting of gallium, aluminum and indium;

wherein said first nitride layer has a thickness larger than a thickness of said second nitride layer.

25. The method of claim 24, further comprising the step of removing said oriented polycrystalline sintered body from said first nitride layer.

26. A method of producing a self-supporting substrate, said method comprising the steps of:
forming a mask for selective growth on an oriented polycrystalline sintered body;
growing a first nitride layer by a hydride vapor deposition method or ammonothermal method so that said first nitride layer has a preferential crystal orientation mostly aligned with a preferential crystal orientation of said oriented polycrystalline sintered body, said first nitride layer comprising a nitride of one or more elements selected from the group consisting of gallium, aluminum and indium; and
growing a second nitride layer on said first nitride layer by a sodium flux method so that said second nitride layer has a preferential crystal orientation mostly aligned with said preferential crystal orientation of said first nitride layer, said second nitride layer comprising a nitride of one or more elements selected from the group consisting of gallium, aluminum and indium;
wherein said first nitride layer has a thickness larger than a thickness of said second nitride layer.

27. The method of claim 26, further comprising the step of removing said oriented polycrystalline sintered body from said first nitride layer.

28. A method of producing a self-supporting substrate, said method comprising the steps of:
processing a surface of an oriented polycrystalline sintered body;
growing a first nitride layer by a hydride vapor deposition method or ammonothermal method so that said first nitride layer has a preferential crystal orientation mostly aligned with a preferential crystal orientation of said oriented polycrystalline sintered body, said first nitride layer comprising a nitride of one or more elements selected from the group consisting of gallium, aluminum and indium; and
growing a second nitride layer on said first nitride layer by a sodium flux method so that said second nitride layer has a preferential crystal orientation mostly aligned with said preferential crystal orientation of said first nitride layer, said second nitride layer comprising a nitride of one or more elements selected from the group consisting of gallium, aluminum and indium;
wherein said first nitride layer has a thickness larger than a thickness of said second nitride layer.

29. The method of claim 28, further comprising the step of removing said oriented polycrystalline sintered body from said first nitride layer.

30. The method of claim 28, wherein said processing of said surface of said oriented polycrystalline sintered body provides a periodic structure.

31. The method of claim 24, wherein said oriented polycrystalline sintered body comprises an oriented polycrystalline alumina sintered body.

32. The method of claim 24, wherein said oriented polycrystalline sintered body has translucency.

33. A method of producing a functional device, said method comprising the steps of:
producing said self-supporting substrate by the method of claim 24; and
providing a functional layer on said self-supporting substrate, said functional layer comprising a semiconductor so that said semiconductor has a preferential crystal orientation mostly aligned with a preferential crystal orientation of said self-supporting substrate.

34. The method of claim 33, wherein said semiconductor forming said functional layer comprises a nitride of one or more elements selected from the group consisting of gallium, aluminum and indium.

35. The method of claim 33, wherein said functional layer has a function of emitting a light.

36. The method of claim 33, wherein said functional layer has a function of rectification.

37. The method of claim 33, wherein said functional layer has a function of controlling an electric power.

* * * * *